United States Patent [19]

Morrill

[11] Patent Number: 6,060,938

[45] Date of Patent: May 9, 2000

[54] OUTPUT BUFFER FOR REDUCING SWITCHING NOISE

[75] Inventor: David P. Morrill, Portland, Me.

[73] Assignee: Fairchild Semiconductor Corp., South Portland, Me.

[21] Appl. No.: 09/136,246

[22] Filed: Aug. 19, 1998

[51] Int. Cl.[7] .......................... H03K 17/16; H03K 17/687
[52] U.S. Cl. .......................... 327/391; 327/112; 327/320; 327/328; 326/27
[58] Field of Search ..................................... 327/379, 387, 327/389, 391, 318, 112, 319, 320, 327, 328; 326/26, 27, 83, 86, 121, 17

[56] References Cited

U.S. PATENT DOCUMENTS

| | | | |
|---|---|---|---|
| 4,818,901 | 4/1989 | Young et al. | 326/27 |
| 4,961,010 | 10/1990 | Davis | 326/27 |
| 5,120,999 | 6/1992 | Schreck et al. | 326/27 |
| 5,237,213 | 8/1993 | Tanoi | 327/205 |
| 5,319,260 | 6/1994 | Wanlass | 326/26 |
| 5,349,247 | 9/1994 | Hush et al. | 327/170 |
| 5,367,645 | 11/1994 | Lubeck et al. | 326/27 |
| 5,382,847 | 1/1995 | Yasuda | 326/21 |
| 5,546,033 | 8/1996 | Campbell et al. | 327/170 |
| 5,552,719 | 9/1996 | Murakami | 326/27 |
| 5,568,081 | 10/1996 | Lui et al. | 327/380 |
| 5,583,460 | 12/1996 | Dohi et al. | 327/126 |
| 5,587,678 | 12/1996 | Dijkmans | 327/108 |
| 5,598,119 | 1/1997 | Thayer et al. | 327/111 |
| 5,694,065 | 12/1997 | Hamasaki et al. | 327/108 |
| 5,699,000 | 12/1997 | Ishikuri | 327/108 |

*Primary Examiner*—Timothy P. Callahan
*Assistant Examiner*—Terry L. Englund
*Attorney, Agent, or Firm*—Pierce Atwood; Chris A. Caseiro

[57] ABSTRACT

An output buffer for reducing the signal noise associated with the switching between logic high and logic low electrical. Signals includes a first clamping circuit linked to the pull-up output transistor of the buffer, and a second clamping circuit linked to the pull-down output transistor of the buffer. The buffer may include both clamping circuits or either the first or second clamping circuit alone, dependent upon signal shaping interests. Each of the clamping circuits includes a selectable delay stage coupled to the buffer's input, a current regulator controlled by the delay stage, and a clamping device that is coupled to the control node of the output transistor. When the current regulator is conducting, the control node of the output transistor is clamped at a potential near its threshold turn-on. As a result, when the clamping circuit is turned off, the output transistor experiences a soft turn-on, thereby reducing signal bounce and the associated noise.

6 Claims, 3 Drawing Sheets

OUTPUT BUFFER FOR REDUCING SWITCHING NOISE

BACKGROUND OF THE INVENTION

1. Field of the Invention

The present invention relates to circuitry for reducing noise (overshoot and undershoot) associated with the switching of electrical signals transmitted from one location to another. In particular, the present invention relates to an output buffer with control circuitry designed to regulate the potential at the control nodes of the buffer's output transistors.

2. Description of the Prior Art

Output buffers are used to transfer electrical signals of desired amplitude and strength. Signal transfers occur by way of buses—interfaces that couple active devices that are either on the same semiconductor-based chip or on different chips. The devices may be located proximate to one another, or they may be some distance from one another. One example of a proximate device interface requiring one or more bus connections is the coupling of one printed circuit board to another within a computing system, such as through a backplane bus. An example of a remote device interface requiring one or more bus connections is the coupling of one computing system to another, such as through a telephone transmission line that is, effectively, a voice/data bus.

Output buffers are used to ensure that electrical signals are transferred as accurately and as quickly as possible. It is often the case, however, that when transmission rates increase, signal accuracy may suffer. In particular, it is well known that rapid signal transmission may be accompanied by signal bounce. That is, the noise or ringing associated with the undershoot and overshoot of a final steady state logic high or logic low signal that occurs in the transition between high and low. The difference in the potentials associated with a high signal and a low signal may be as small as 0.4 V or as great as 5 V. For Complementary Metal Oxide Semiconductor (CMOS) based logic, for example, a logic high corresponds to a nominal 5.0 V potential (for a 5.0 V power supply) and a nominal 3.3 V potential (for a 3.3 V power supply), while a logic low is essentially equivalent to ground (GND) or 0.0 V.

The potentials associated with high and low signals described above are idealized values. In fact, highs and lows generally fall within a range of potentials associated with the indicated values. Thus, for a 3.3 V supply, a high signal may be supplied at 2.6 V, for example, while a low signal may actually be associated with a 0.7 V value. As the potentials of the power supplies used to power circuitry move closer to GND, the signal bounce mentioned above takes on greater importance. In particular, the initial oscillation around the ultimate steady state value that occurs when the transition between high and low is triggered may vary enough to generate a false logic signal. The noise swing may be enough to cause a low signal to transition to a high-signal potential and vice-versa, or it may be variable enough that the signal is not clearly at either a high potential or a low potential. Either situation is undesirable. For that reason, it is becoming increasingly important that the transitions between high and low signals occur with less noise than has been previously experienced.

Clearly, unexpected changes in logic values are not desirable. This problem is more likely to occur as transmission rates are increased. Increasing transmission rates enables the transfer of more data in a shorter time period and so is desirable in many respects. However, the gain in increased transmission rate is often undermined by an increase in signal noise. That is, a rapid change in signal level creates an oscillation about the steady state value corresponding to the sudden switching on or off of a transistor. As transistors become increasingly smaller in order to achieve the faster transmission rates of interest, the signal bounce that occurs with the rapid switching often creates reflections in transmission media, such as telephone transmission lines where reflections will cause signal errors. It is therefore important to enable "gentle" switching of buffer circuits so that signal noise is reduced.

A simplified illustration of a prior-art buffer circuit of the type that exhibits unacceptable signal bounce characteristics is presented in FIG. 1. The buffer circuit includes an input node input for receiving an electrical signal, and an output node output for the transfer of that signal to downstream circuitry. The input node is coupled to an inverter IV1 formed of P-type MOS transistor M1 and N-type MOS transistor M2. The output of the inverter IV1 is connected to the control node of pull-up P-type MOS transistor M3 and pull-down N-type MOS transistor M4. One and only one of transistors M3 and M4 is supposed to be turned on at a given time. When transistor M3 is on, the gate-source voltage (Vgs) exceeds the transistor's threshold voltage (Vt). The output node is at a logic high potential equivalent to high-potential power rail Vcc less the drain-source voltage (Vds) drop associated with transistor M3. In the case of MOS transistors, Vt is about 0.7 V. When transistor M4 is on, the output node is at a logic low potential equivalent to low-potential power rail GND. It can be seen that signal bounce at the control nodes of transistors M3 and M4 may create the situation where the wrong one may be on, they may be conducting simultaneously, or they may both be off. As indicated, any one of those conditions is undesirable.

Several attempts have been made to reduce the noise associated with a signal transition. U.S. Pat. No. 5,699,000 issued to Ishikuri describes a buffer circuit having means for regulating the voltage applied to the gates of the pull-up and pull-down transistors. This design affects transistor turn-on delay; however, it fails to solve overshoot and undershoot problems. U.S. Pat. No. 5,568,081 issued to Lui et al. describes a means for regulating the slew rate for the potential applied to the pull-up and pull-down transistors. The Lui buffer is quite complicated in that it utilizes a multitude of components. Such a complicated design makes it difficult to tune the turn-on of the output transistors. It also takes up more space on a chip than is otherwise desirable.

Therefore, what is needed is a buffer circuit that reduces the noise associated with signal switching without significantly compromising transmission rate. What is also needed is a buffer circuit that may be tuned to regulate the rate of turn-on of a pull-up or pull-down transistor. Further, what is needed is a "quiet" output buffer circuit that achieves the noted goals without complicated circuitry that takes up valuable layout space.

SUMMARY OF THE INVENTION

It is an object of the present invention to provide an output buffer circuit with minimized noise associated with signal switching. It is an object of the present invention to provide that capability without significantly compromising transmission rate. It is also an object of the present invention to provide an output buffer circuit that may be tuned to regulate the rate of turn-on of a pull-up or pull-down transistor. It is a further object of the present invention to provide a quiet output buffer circuit that achieves the noted goals without complicated circuitry that takes up valuable layout space.

These and other objects are achieved in the present invention by clamping the potential at the control node of the non-conducting one of the two output transistors approximately at its threshold value. When an input signal switches, the clamping circuitry of the present invention maintains the potential at the control node of that non-conducting transistor at the threshold value. The clamping circuitry provides a selectable delay in the propagation of the switched signal such that the control node of the non-conducting output transistor remains at the threshold turn-on potential until the conducting output transistor turns off. Only when that occurs will the clamping circuitry permit the potential at the clamped output transistor to change so as to enable full and complete turn on of that transistor. The result is a softening of the turn-on transition in a way that minimizes signal noise and therefore minimizes the chance that an erroneous or ambiguous output signal will be transmitted.

The clamping circuitry of the present invention includes a first clamping sub-circuit for softening logic low to logic high transitions, and a second clamping sub-circuit for softening logic high to logic low transitions. An output buffer may incorporate either or both of the clamping sub-circuits as a function of the signal noise problem to be corrected. However, it is generally desirable to include both sub-circuits to provide output symmetry.

The first clamping sub-circuit includes a pull-up diode device coupled to the control node of the pull-up output transistor, a pull-up current regulator coupled between the pull-up diode device and the high-potential power rail, and a pull-up delay stage coupled between the input inverter's output and the pull-up current regulator. The second clamping sub-circuit is similarly configured. Specifically, the second sub-circuit includes a pull-down diode device coupled to the control node of the pull-down output transistor, a pull-down current regulator coupled between the pull-down diode device and the low-potential power rail, and a pull-down delay stage coupled between the input inverter's output and the pull-down current regulator.

The first clamping sub-circuit and the second clamping sub-circuit may, and preferably do, use substantially the same components to form the delay stage, the diode device, and the current regulator. In particular, the delay stage of either sub-circuit includes one or more inverter stages. The number and size of the inverter stages is dependent upon the delay desired between the turning off of the conducting output transistor and the turning on of the non-conducting output transistor when a signal switch occurs. The diode device may be one or more diodes in series or parallel, or a diode-connected transistor, such as a bipolar or MOS transistor. The current regulator is a transistor, either bipolar or MOS, having its control node tied to the output of the delay stage. When it is on, current passes through it and the diode device. When the current regulator is turned off pursuant to a controlling signal from the delay stage, the current and potential to the output transistor's control node rises so that that transistor is turned completely on.

The clamping circuit of the present invention is a simple means of regulating the turning on of either or both of the output transistors of an output buffer. The clamping circuit can be used to define the turn-on rate of the selected output transistor to ensure that turn on is achieved relatively quietly without compromising system propagation rates. The clamping circuit operates to keep the control node of an output transistor near its turn-on threshold thereby avoiding the signal bounce problems that occur as that threshold is traversed. These and other advantages of the present invention will become apparent upon review of the detailed description, the accompanying drawings, and the appended claims.

DESCRIPTION OF THE PREFERRED EMBODIMENT OF THE INVENTION

Figure 1:
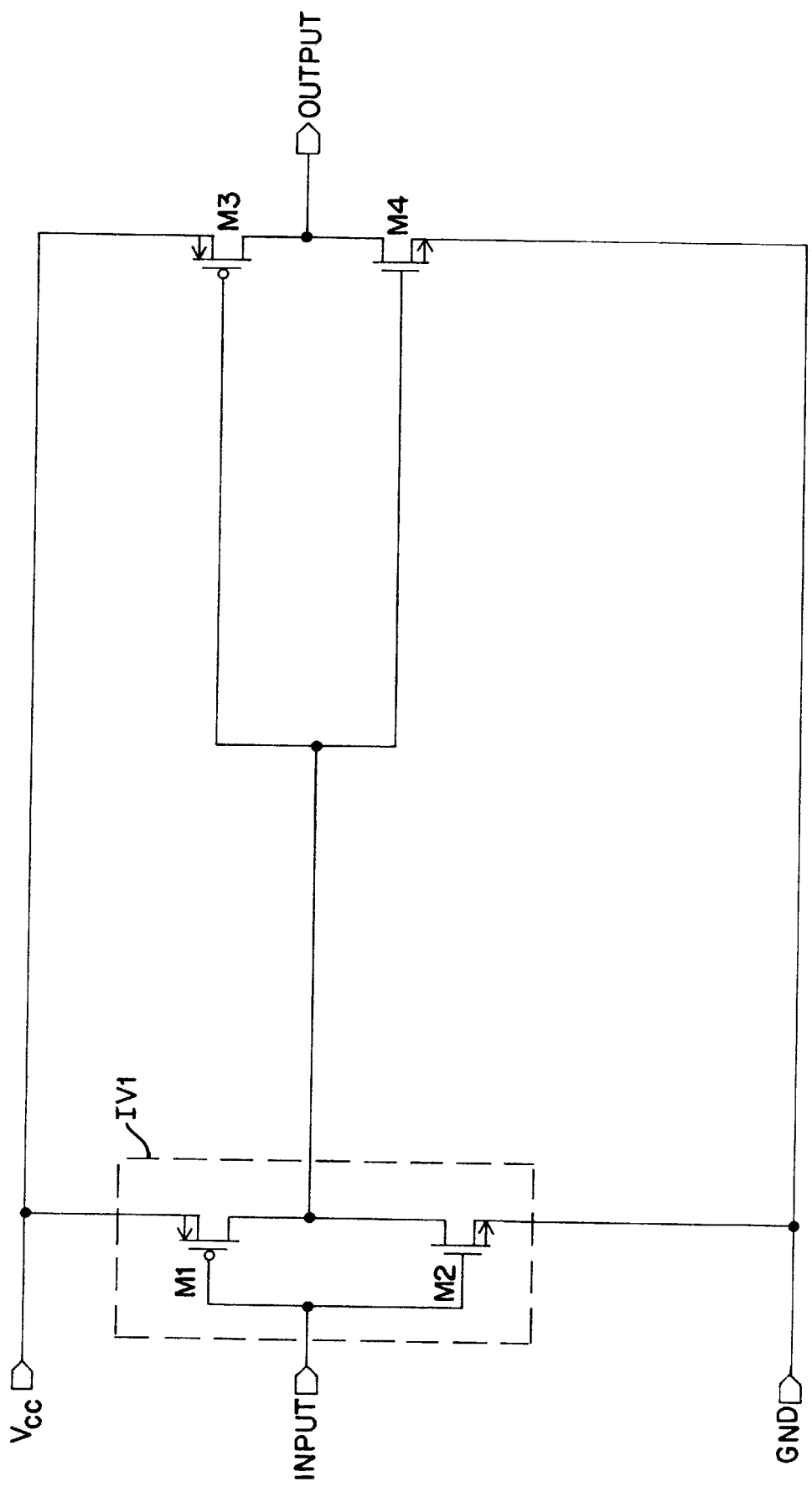
FIG. 1 is a simplified circuit diagram showing a generic prior-art output buffer.
Figure 2:
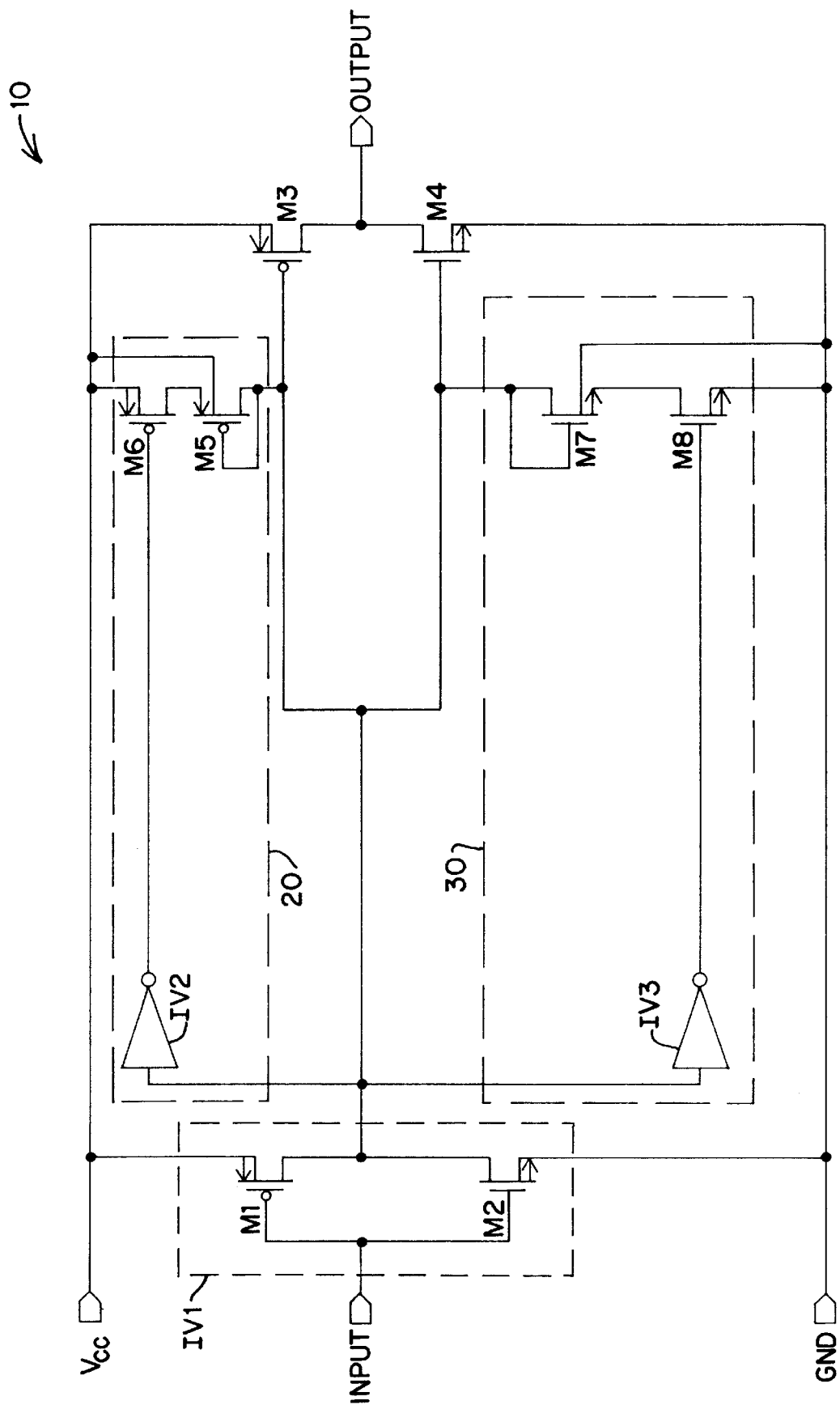
FIG. 2 is a simplified circuit diagram showing the output driver of the present invention including one clamping sub-circuit for each of the output transistors.

An output buffer 10 of the present invention is shown in FIG. 2. Those components of the buffer 10 that are the same as the components of the prior-art output buffer of FIG.1 are assigned the same component designations. Thus, inverter IV1, formed of transistors M1 and M2 is the same, as are the input node input, the output node output, the high-potential power rail Vcc, the low-potential power rail GND, pull-up output transistor M3, and pull-down output transistor M4. It is to be noted that output transistors M3 and M4 are modified in operation by the clamping sub-circuits of the present invention to be described herein.

The buffer 10 of the present invention includes first clamping sub-circuit 20 for modifying the turn-on of pull-up transistor M3, and second clamping sub-circuit 30 for modifying the turn-on of pull-down transistor M4. The first clamping sub-circuit 20 includes inverter IV2, pull-up current regulating transistor M6, and diode-wired pull-up transistor M5. Inverter IV2 has an input coupled to the output of inverter IV1 and an output coupled to a control node of P-type MOS transistor M6. Inverter IV2 acts as a delay stage to control the turning on of the current regulator that is transistor M6. It is to be understood that inverter IV2 may actually be a plurality of inverters or logic gates in series and sized as a function of the desired propagation delay. When transistor M6 is conducting, P-type diode-wired MOS transistor M5 acts to clamp the potential at the control node of transistor M3 to the equivalent of about the potential of Vcc less the drop across that diode-acting transistor M5. At that clamped potential, pull-up output transistor M3 is off but nearer its threshold turn-on potential than that provided in the prior-art buffer.

Sub-circuit 30 includes inverter IV3, pull-down current regulating transistor M8, and diode-wired pull-down transistor M7. Inverter IV3 has an input coupled to the output of inverter IV1 and an output coupled to a control node of N-type MOS transistor M8. Inverter IV3 acts as a delay stage to control the turning on of the current regulator that is transistor M8. It is to be understood that inverter IV3 may actually be a plurality of inverters or logic gates in series and sized as a function of the desired propagation delay. When transistor M8 is conducting, N-type diode-wired MOS transistor M7 acts to clamp the potential at the control node of transistor M4 to the equivalent of about the potential of GND plus the drop across that diode-acting transistor M7. At that clamped potential, pull-down output transistor M4 is off but nearer its threshold turn-on potential than that provided in the prior-art buffer.

In operation, the circuit 10 acts as follows. When the buffered signal is at a logic high, transistor M3 is conducting and transistor M4 is not conducting. In addition, transistor M6 is not conducting and transistor M8 is conducting. The gate of transistor M4 is grounded through transistor M2 until a transition is initiated. At that time, when transistor M1 turns on, transistor M4 is clamped through transistor M7. That is, transistor M4 is completely off until a transition occurs. (Transistor M3 operates in a similar opposing manner.) When input switches from high to low, corresponding to a desired output signal switch from high to low, the gate of M3 is driven high, and it becomes non-conducting. In addition, the gate of M4 is driven high. However, the connection of M4 to M7 clamps the potential at that node to the diode drop as long as MB remains on. Therefore, M4 remains off. The selectable propagation delay through inverter IV3 delays the signal transmission to the gate of M8. When that occurs, M8 turns off and the gate of M4 becomes fully charged such that that transistor conducts, thereby providing a logic low potential equivalent to the output node output.

For the low to high switching, the gate of M4 is driven low, and it proceeds to become non-conducting. In addition, the gate of M3 is driven to low. However, the connection of the gate of M3 to MS clamps the potential at that node to the diode drop equivalent as long as M6 remains on. Therefore, M3 remains off. The selectable propagation delay through inverter IV2 delays the transmission of a logic high to the gate of M6. When that occurs, M6 turns off and the gate of M3 becomes fully charged such that that transistor conducts, thereby providing a logic high potential equivalent to the output node output.

Figure 3:
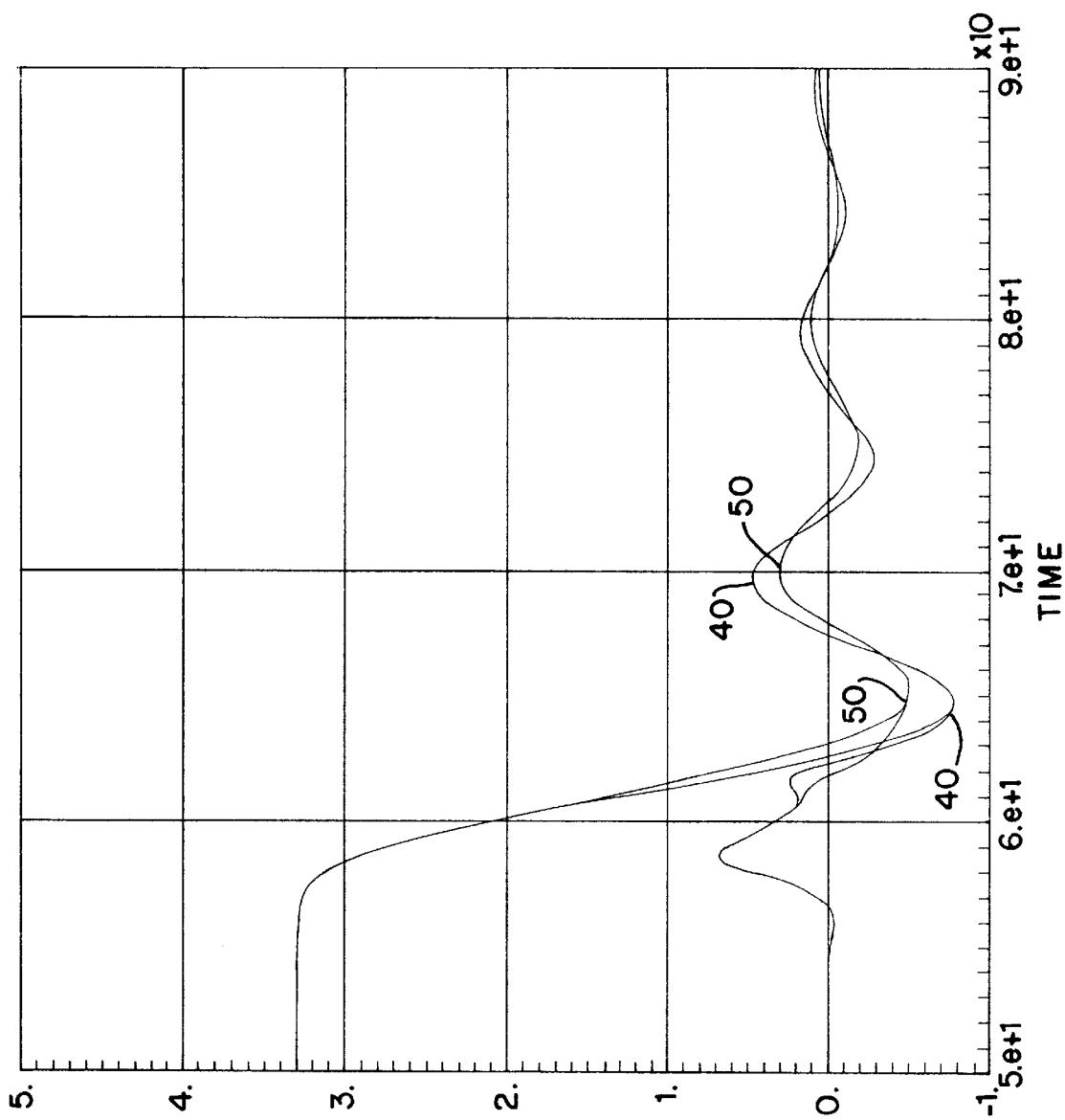
FIG. 3 is a waveform illustrating the noise reduction in a high-to-low transition provided by the clamping circuit for an output buffer of the present invention as compared to the prior-art buffer shown in FIG. 1.

FIG. 3 illustrates the advantage of the application of the second clamping circuit 30 in regard to the softening of a high-to-low transition of a buffered signal. Line 40 represents the signal transition through the prior-art buffer, while line 50 represents the signal transition through buffer 10. As can be seen, the peak-to-peak oscillation occurring with the prior-art buffer is about 1.1 V, representing a significant and undesirable signal bounce. On the other hand, buffer 10 reduces that peak-to-peak oscillation to about 0.8 V—a difference of 0.3 V. Such a difference is significant under the operating head of present and proposed future computing systems.

While the invention has been described with reference to particular example embodiments, it is intended to cover all modifications and equivalents within the scope of the following claims.

I claim:

1. An output buffer having an input node and an output node, the buffer comprising:
    a. a pull-up transistor having a control node coupled to the input node, a high-potential node coupled to a high-potential power rail, and a low-potential node coupled to the output node;
    b. a pull-down transistor having a control node coupled to the input node, a high-potential node coupled to the output node, and a low-potential node coupled to a low-potential power rail;
    c. a first clamping sub-circuit including a first delay stage, a first diode device, and a first current regulator, wherein said first delay stage includes an input node coupled to the input node of the output buffer, and an output node coupled to a control node of said first current regulator, wherein said first diode device includes a low-potential node coupled to said control node of said pull-up transistor and a high-potential node coupled to a low-potential node of said first current regulator, and wherein said first current regulator includes a high-potential node coupled to said high-potential power rail; and
    d. a second clamping sub-circuit including a second delay stage, a second diode device, and a second current regulator, wherein said second delay stage includes an input node coupled to the input node of the output buffer, and an output node coupled to a control node of said second current regulator, wherein said second diode device includes a high-potential node coupled to said control node of said pull-down transistor and a low-potential node coupled to a high-potential node of said second current regulator, and wherein said second current regulator includes a low-potential node coupled to said low-potential power rail.

2. The buffer as claimed in claim 1 wherein said first delay stage includes one or more inverters and wherein said second delay stage includes one or more inverters.

3. The buffer as claimed in claim 2 wherein said first current regulator is a PMOS transistor and said second current regulator is an NMOS transistor.

4. The buffer as claimed in claim 3 wherein said first diode device is a diode and said second diode device is a diode.

5. The buffer as claimed in claim 3 wherein said first diode device is a diode-wired PMOS transistor and said second diode device is a diode-wired NMOS transistor.

6. A method for reducing signal noise associated with the transition between logic high and logic low potentials in a buffer having an input node, an output node, and a pull-up transistor and a pull-down transistor coupled to the output node, the method comprising the steps of:
    a. clamping the potential at a control node of the pull-up transistor at a level near a threshold turn-on potential of the pull-up transistor when the pull-up transistor starts to conduct;
    b. eliminating the clamping of the potential at the control node of the pull-up transistor after a first selectable delay in order to enable full charging of the control node of the pull-up transistor when the pull-up transistor is to be conducting;
    c. clamping the potential at a control node of the pull-down transistor at a level near a threshold turn-on potential of the pull-down transistor when the pull-down transistor starts to conduct; and
    d. eliminating the clamping of the potential at the control node of the pull-down transistor after a second selectable delay in order to enable full charging of the control node of the pull-down transistor when the pull-down transistor is to be conducting.

* * * * *